(12) United States Patent
Chao et al.

(10) Patent No.: US 6,380,783 B1
(45) Date of Patent: Apr. 30, 2002

(54) CYCLIC PHASE SIGNAL GENERATION FROM A SINGLE CLOCK SOURCE USING CURRENT PHASE INTERPOLATION

(75) Inventors: Chieh-Yuan Chao, Fremont; Yuming Cao, Pleansaton, both of CA (US)

(73) Assignee: Silicon Communications Lab, Inc., Milpitas, CA (US)

( * ) Notice: Subject to any disclaimer, the term of this patent is extended or adjusted under 35 U.S.C. 154(b) by 0 days.

(21) Appl. No.: 09/688,536

(22) Filed: Oct. 13, 2000

(51) Int. Cl.[7] ............................................... H03H 11/26
(52) U.S. Cl. ....................................... 327/258; 327/239
(58) Field of Search ................................. 327/231, 237, 327/239, 250, 251, 256–259, 295

(56) References Cited

U.S. PATENT DOCUMENTS 5,523,984 A * 6/1996 Sato et al. .................. 327/258

* cited by examiner

*Primary Examiner*—Kenneth B. Wells
(74) *Attorney, Agent, or Firm*—Chien-Wei (Chris) Chou; Oppenheimer Wolff & Donnelly LLP

(57) ABSTRACT

A system and corresponding method for generating multiple phases within a single clock cycle of an input signal is disclosed. The method includes the steps of generating a plurality of output signals from an input source signal, where each of the plurality of output signals represents a phase-shifted version of the input signal. Next, select a pair of signals from the plurality of output signals to act as clock signals, where the selected pair of clock signals define the operating region within which the multiple phases are bounded. Then, provide a pair of complementary weighted bias currents in response to a control signal, where each of the complementary bias currents is used to generate the multiple phases of the present invention. Thereafter, the pair of weighted bias currents presented to a node are adjusted in response to the selected pair of clock signals, where the selected pair of clock signals operates to adjust the rate of change of the weighted bias currents. Finally, a plurality of signals are provided that represent the frequency difference between the first adjusted weighted bias current and a second frequency.

15 Claims, 6 Drawing Sheets

CYCLIC PHASE SIGNAL GENERATION FROM A SINGLE CLOCK SOURCE USING CURRENT PHASE INTERPOLATION

FIELD OF THE INVENTION

The present invention generally relates to digital clock signal generators and, more particularly, to a system and corresponding method of generating multiple clock phases within a single clock period of an input signal.

BACKGROUND OF THE INVENTION

Multi-phase devices are used in connection with any group or series of devices that operate at different frequencies. For example, many application specific integrated circuits (ASIC) include components (i.e. gates, processors, repeaters) that operate at different frequencies. Consequently, each of these components requires their own clock signal. In practice, these multiple clock signals are generated through the use of either a phase-locked loop (PLL) or a delay-locked loop (DLL). PLL include voltage-controlled oscillator (VCO) cells that provide signals at a specific frequency. The greater the number of signals that are to be generated by the PLL, the greater the number of VCO cells that are required to be included within the PLL. A drawback associated with having multiple VCO cells within a single device is that the corresponding PLL will take up valuable real estate on the integrated circuit board. With the trend in the electronics industry moving toward reducing the footprint of devices, taking up valuable real estate with PLL's becomes a concern.

Another drawback associated with using PLL's having multiple VCO cells is that the operating frequency range available to each of the PLL's will necessarily have to be reduced. Thus, multiple PLL systems are not suitable for high frequency applications or devices. With electronic devices now operating at frequencies greater than 650 MHz, conventional multiple PLL systems are not practical.

Another consideration that becomes important when using PLL systems is that the VCO cells within each PLL requires a minimum amount of power to operate properly. Thus, the greater the numbers of VCO cells that are present in a PLL, the greater the amount of power that is being used by the PLL system. This can significantly impact the performance of a low power system. The greater the amount of power being used by the PLL, the less amount of power that is available for the remainder of the components of the system.

SUMMARY OF THE INVENTION

The aforementioned and related drawbacks associated with conventional methods of generating multiple phases from an input signal are substantially reduced or eliminated by the present invention. The present invention is directed to a system and corresponding method for generating multiple phases within a single period of an input source signal. The multiple phases generated by the system of the present invention have a cyclic property. This cyclic property of the multiple phases means that the generated phases form a cycle of increasing or decreasing phases that complete over 360 degrees of a clock cycle.

According to the present invention, the method employed to generate multiple phases from a single input source, comprises the steps of generating a plurality of output signals from an input signal, each of the plurality of output signals representing a phase-shifted version of the input signal; selecting a pair of signals from the plurality of output signals to act as clock signals, the selected pair of clock signals defining the operating region of the multiple phases; providing a pair of complementary weighted bias currents, the pair of complementary weighted bias currents used to generate the multiple phases within the operating region in response to a control signal; adjusting the pair of weighted bias currents in response to the selected pair of clock signals, the selected pair of clock signals operative to adjust the rate of change of the weighted bias currents present at an output node; and providing a plurality of signals representing the difference between the value of a first one of the adjusted weighted bias currents and a second signal.

In a preferred embodiment of the present invention, the second signal is provided by a second one of the adjusted weighted bias currents. In an alternate embodiment of the present invention, the second signal is provided by a signal having a constant frequency.

According to the present invention, the system employed to generate multiple phases within a single period of an input source signal comprises an output signal block for generating a plurality of output signals in response to an input signal, each of the output signals being a phase-shifted version of the input signal; a quadratic region selection block for selecting a pair of clock signals from the plurality of output signals, the selected pair of clock signals defining the operating timing region of the multiple phases; a weighted bias current block for providing a pair of weighted complementary bias currents, the pair of weighted complementary bias currents used to generate the multiple phases within the operating timing region in response to a control signal; and a current phase interpolator block operative to generate the multiple phases by adjusting the application of the pair of weighted complementary bias currents to an output phase node in response to the selected pair of clock signals.

The weighted bias current block which provides the pair of complementary bias currents further includes a current source, a plurality of selection transistors and a pair of output nodes, wherein one of the output nodes provides a first weighted bias current in response to the selected clock signals being applied to the plurality of selection transistors, and the second output nodes provides a second weighted bias current in response to the selected clock signals being applied to the plurality of selection transistors, the second weighted bias current having a value complementary to the value of the first weighted bias current.

An advantage provided by the present invention is that it provides the ability to generate multiple clock phases within a single clock period of a source clock without the use of a phase-locked loop.

Another advantage provided by the present invention is that it provides the ability to generate multiple clock phases within a single clock period of a source clock without the use of a delay-locked loop.

Yet another advantage provided by the present invention is that multiple clock phases can be generated from a single clock source with no restriction on input clock frequency.

A feature of the present invention is that it is straightforward to implement.

Another feature of the present invention is that it reduces the footprint required of multi-phase devices.

BRIEF DESCRIPTION OF THE DRAWINGS

The aforementioned and related advantages and features of the present invention will become apparent upon review of the following detailed description of the invention, taken in conjunction with the following drawings, where like numerals represent like elements, in which.

DETAILED DESCRIPTION OF THE INVENTION

Figure 1:
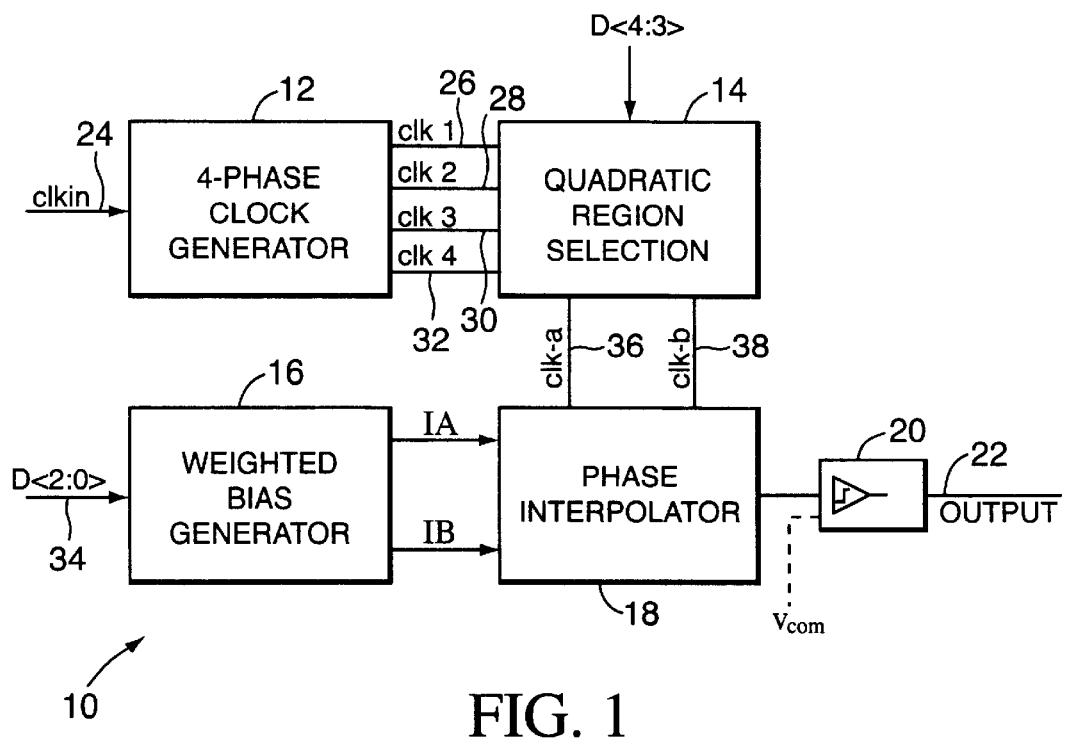
FIG. 1 is a block diagram of the multi-phase generation system according to a preferred embodiment of the present invention.

The multi-phase generation system will now be described with reference to FIGS. 1–8. FIG. 1 is a block diagram of the multi-phase generation system according to a preferred embodiment of the present invention. As illustrated in FIG. 1, the multi-phase generation system 10 of the present invention includes a four-phase clock generation block 12, a quadratic region selection block 14, a programmable weighted bias current generation block 16 and a current phase interpolation block 18. The output 22 of the multi-phase generation system 10 is comprised of a comparator 20.

Figure 2:
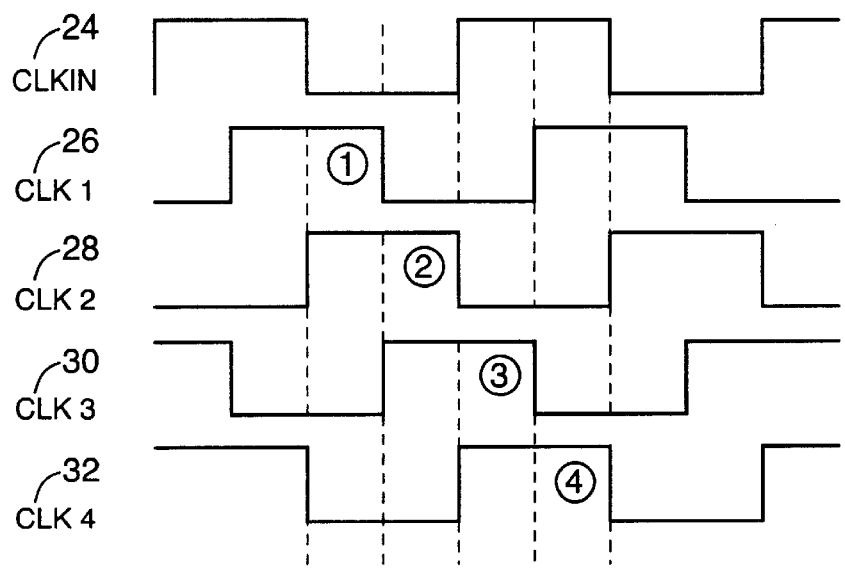
FIG. 2 is a timing diagram illustrating the operating region signals generated by the four-phase clock generation block of the multi-phase generation system according to the present invention.

The four-phase clock generation block 12 is operative to generate four phase-shifted versions (clk1–clk4) of an input source (clock) signal clkin 24. As shown in FIG. 2, each of the output signals, clk1 26, clk2 28, clk3 30, clk4 32, of the four-phase clock generation block 12 is shifted ($2\pi/n$) degrees relative to the input clock signal clkin 24, where n represents the number of phase shifted clock signals that are to be produced. In a preferred embodiment of the present invention, n equals 4. More specifically, clk1 26 is phase-shifted 90° ($\pi/2$) relative to clkin 24; clk2 28 is phase-shifted 180° relative to clkin 24; and clk3 30 is phase-shifted 270° relative to clkin 24; and clk4 32 is in phase with clkin 24, thus clk4 32 is phase-shifted 0° relative to clkin 24. For purposes of the present invention, any suitable method can be used to generate phase-shifted clock signals from an input signal. Examples of such methods include using an integrator coupled to an input signal to generate the phase-shifted output signals. A PLL can also be used to generate the phase-shifted output signals, clk1–clk4. Such methods are known to those of ordinary skill in the art and will not be discussed in greater detail herein.

Figure 3:
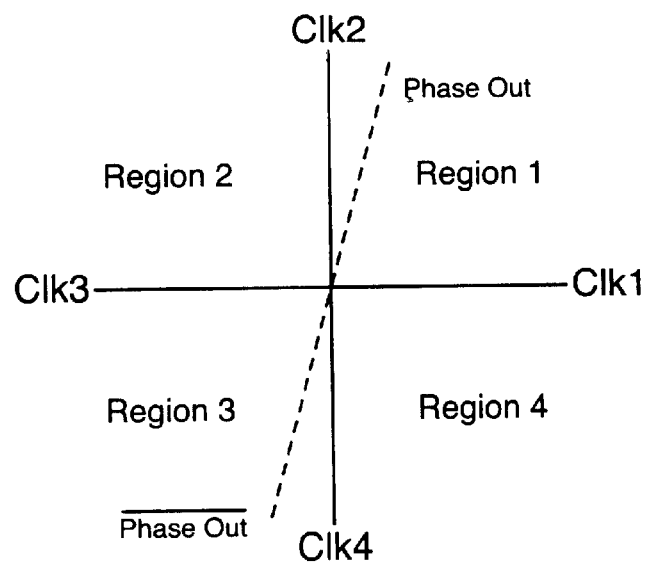
FIG. 3 is a graphical depiction of the operating regions defined by the quadratic region selection block of the multi-phase generation system according to the present invention.

The four phase-shifted signals, clk1–clk4, are then provided to the quadratic region selection block 14. The quadratic region selection block 14 determines the particular operating region within which the multiple phases of clkin will reside in response to the phase-shifted signals, clk1–clk4 and input selection bits D<4:3>34 from a phase selection controller (not shown). The operating region is defined or bounded by the output signals clk_a 36 and clk_b 38 of the quadratic region selection block 14. The quadratic region selection block 14 may be implemented by software alone, or by a combination of appropriate hardware and/or software in the system. The quadratic region selection block 14 generates the four clock operating regions defined by the four phase-shifted signals clk1–clk4 as illustrated in FIG. 3.

Referring back to FIG. 2, an operating region is defined by the overlapping phases of two clock signals both being a logical one (i.e. high). More specifically, as shown in FIG. 2, operating region 1 is defined as being the overlapping periods of clk1–clk2. Operating region 2 is defined as being the overlapping periods of clk2–clk3. Operating region 3 is defined as being the overlapping periods of clk3–clk4. Finally, operating region 4 is defined as being the overlapping periods of clk4–clk1.

Figure 4:
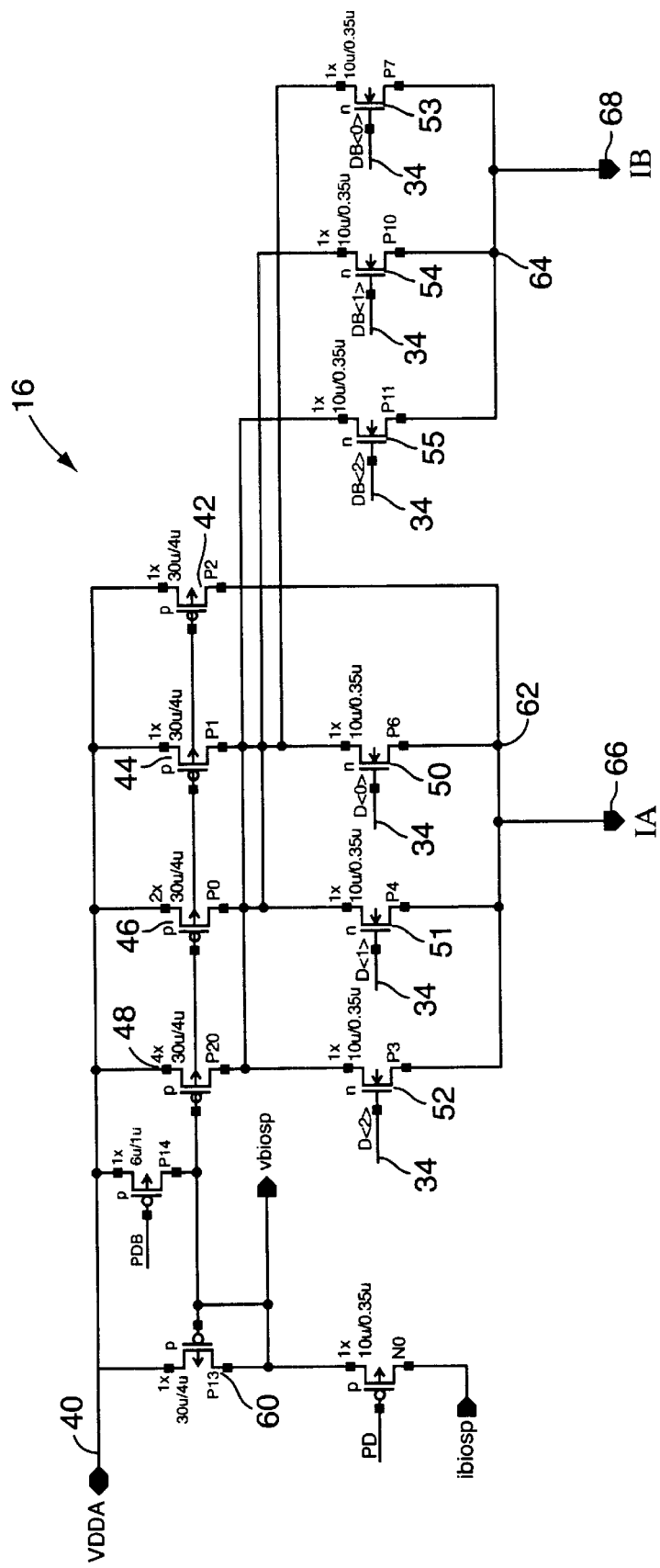
FIG. 4 is a schematic diagram of the weighted bias current block according to a preferred embodiment of the present invention.

The weighted bias current generation block 16 of the present invention will now be described with reference to FIG. 4. As shown in FIG. 4, the weighted bias current generation block 16 includes a constant power source $V_{DD}$ 40, and a plurality of binary weighted bias reference transistors 42–48 coupled to $V_{DD}$. As they are binary weighted, each of the bias reference transistors 42–48 provide a fraction of the total current generated by the current generation block 16. For example, bias reference transistor 42 is configured to provide ⅛ of the total current; bias reference transistor 44 is configured to provide ⅛ of the total current; bias reference transistor 46 is configured to provide ¼ of the total current; and bias reference transistor 48 is configured to provide ½ of the total current. In a preferred embodiment of the present invention, the binary weighted bias reference transistors 42–48 are p-type metal oxide field effect transistors (MOSFETs), each having a source, drain and a gate. The drains of the bias reference MOSFETs are coupled to $V_{DD}$ 40. The gates of the bias reference MOSFETs are coupled to a control transistor 60. The sources of the bias reference MOSFETs are coupled to a plurality of complementary configured selection transistors 50–55.

The selection transistors 50–55 are comprised of n-type MOSFETs, each having a source, drain and gate. The drains of the selection transistors are connected to the source of corresponding bias reference transistor 42–48. The gates of the respective selection transistors 50–55 are connected to input selection bits D<2:0>34 from a selection controller (not shown). As the selection transistors are separated into complementary groups, the gates of the first group of selection transistors 50–52 are coupled to the input selection bits D<2:0>, respectively. The gates of the second group of selection transistors 53–55 are coupled to the inverse of the input selection bits DB<2:0>, respectively. The sources of the first group of selection transistors 50–52 are connected to a first common node 62. The first common node 62 is electrically connected to first output node 66. The sources of the second group of selection transistors 53–55 are connected to a second common node 64. The second common node 64 is electrically connected to second output node 68. According to the present invention, the currents provided by the first output node 66 (IA) and the current provided by the second output node 68 (IB) are complementary. Thus, the resulting output of the weighted bias current generation block 16 is constant. More specifically, when the current present at the first output node has a particular value represented as IA, the current present at the second output node 68 has a particular value, IB=1−IA.

The amount of current present at the respective output nodes of the weighted bias current block 16 is controlled by application of input selection bits D<2:0>. Thus, the amount of bias current provided by the weighted bias current block 16 is programmable. For example, if the input selection bits were set to <0,0,1>, selection transistor 50 would be turned on, thereby passing ¼ of the total current provided by the generation block 16 to the first output node 66. The remaining ¾ of the total current provided by the generation block 16 will be present at the second output node 68. These currents are then provided to the phase interpolator block 18 as currents IA and IB, respectively.

Figure 5:
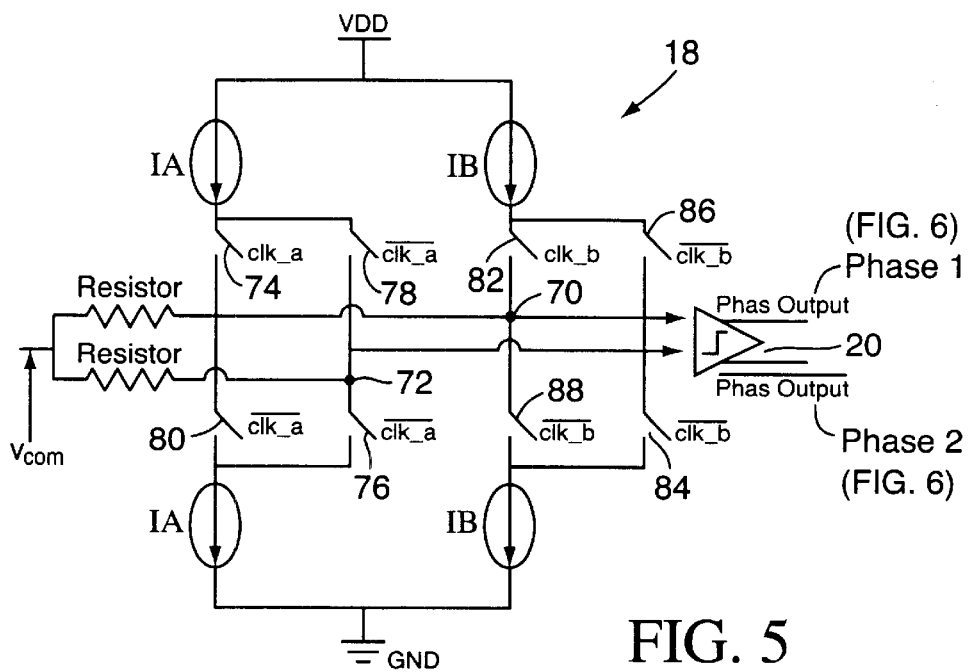
FIG. 5 is a circuit diagram of the current phase interpolator block according to a preferred embodiment of the present invention.
Figure 5A:
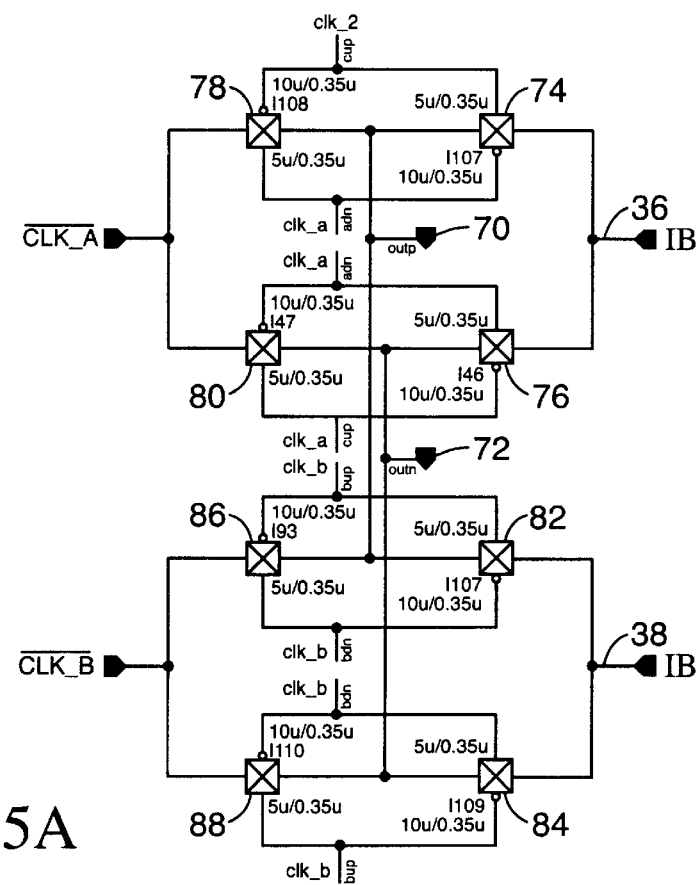
FIG. 5A is a schematic diagram of the charge adjusting switches used in the current phase interpolator block illustrated in FIG. 5.

The current phase interpolation block will now be described with reference to FIGS. 5 and 5A. FIG. 5 is a circuit diagram of the current phase interpolation block 18 according to a preferred embodiment of the present invention. As shown in FIG. 5, the weighted currents IA and IB from output nodes 66 and 68 of the weighted bias current generation block 16, respectively, are used to increase/decrease the charge present at a first interpolator output node 70 based on the application of the clock signals clk_a 36 and clk_b 38 generated by the quadratic region selection block 14 to charge adjusting transistors 74–88 (FIG. 5A). Because IA and IB have different relative weights, the charge slope representing the amount of voltage present at the first interpolator output node 70 corresponding to IA and IB will be different. The voltage present at the first interpolator output node 70 is illustrated as Trace 1 in FIG. 6. Likewise, the weighted currents IA and IB are also used to increase/decrease the charge present at a second interpolator output node 72 based on the application of the inverted version of the clock signals clk_a 36 and clk_b 38 to charge adjusting transistors 78, 80, 86 and 88 (FIG. 5A). Because IA and IB have different relative weights, the charge slope representing the amount of voltage present at the second interpolator output node 72 will also be different. The voltage present at the second interpolator output node 72 is illustrated as Trace 2 in FIG. 6.

Figure 6:
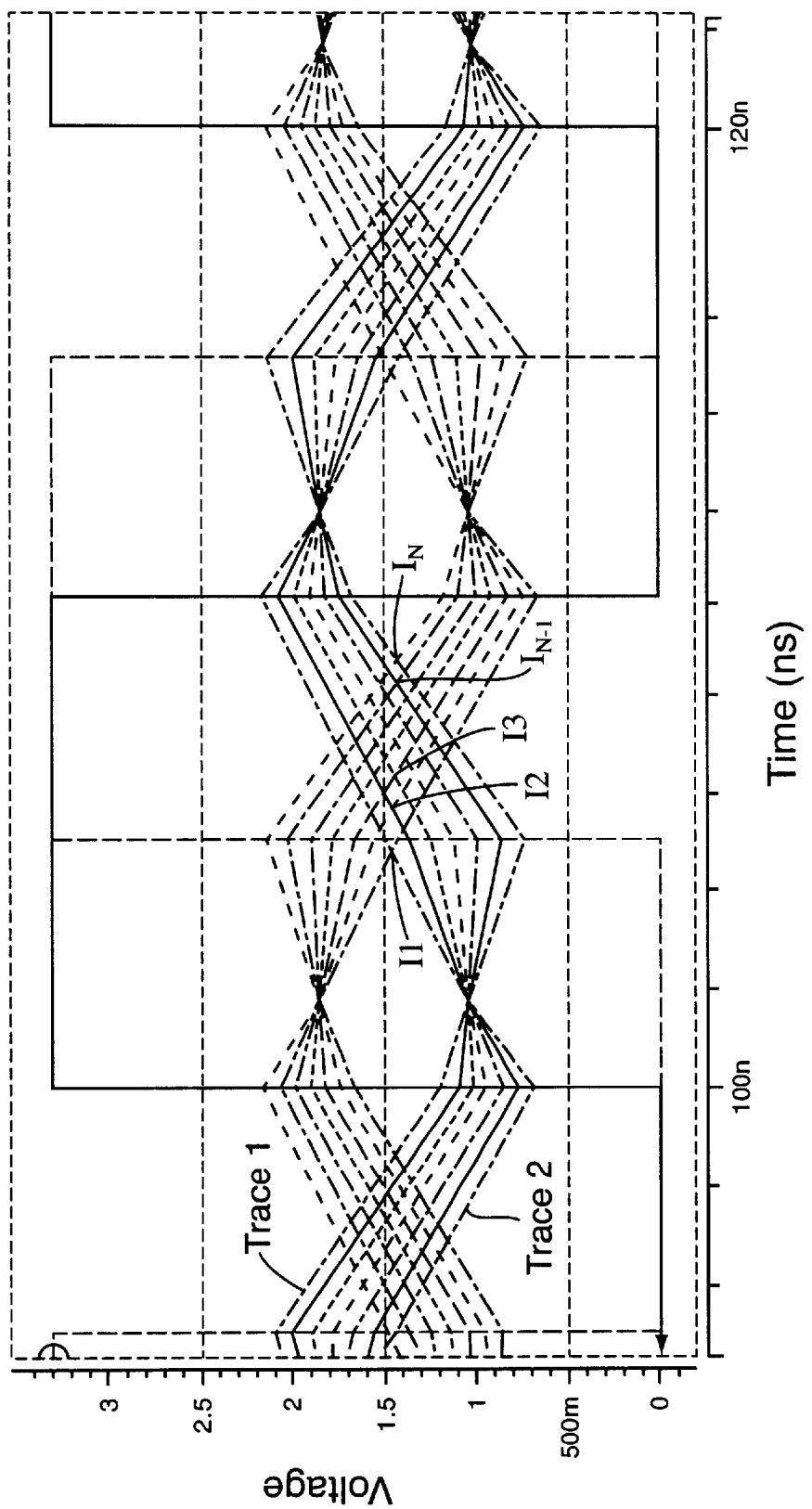
FIG. 6 is a graph representing voltage versus time for the signals generated by the current phase interpolator block illustrated in FIG. 5.

The amount of time IA and IB are charging the first and second interpolator output nodes 70 and 72, respectively, is controlled by the clock signals clk_a 36 and clk_b 38 that control the on/off periods of the charge adjusting transistors 74–88 as shown in FIG. 5A. In operation, the first interpolator output node 70 will charge to a particular voltage when clk_a 36 is a logical one (or high). The rising slopes of Trace 1 illustrated in FIG. 6 represents this charge increase. The discharging of the first interpolator output node 70 occurs when clk_b 38 is a logical one (or high), which corresponds to clk_a 36 being a logical zero (or low). The falling slopes of Trace 1 illustrated in FIG. 6 represents this decrease in charge. When clk_a 36 is logical zero, the inverse clock signal is provided to the gates of charge adjusting transistors 78 and 80 (FIG. 5A), which, in turn, increases the charge present at the second output node 72 as illustrated in Trace 2. Correspondingly, when clk_a 36 is logical one, the inverse clock signal is provided to the gates of charge adjusting transistors 78 and 80 which in turn, decrease the amount of charge present at the second output node 72. This decrease in charge is represented by the falling slopes of Trace 2 as illustrated in FIG. 6.

Figure 7:
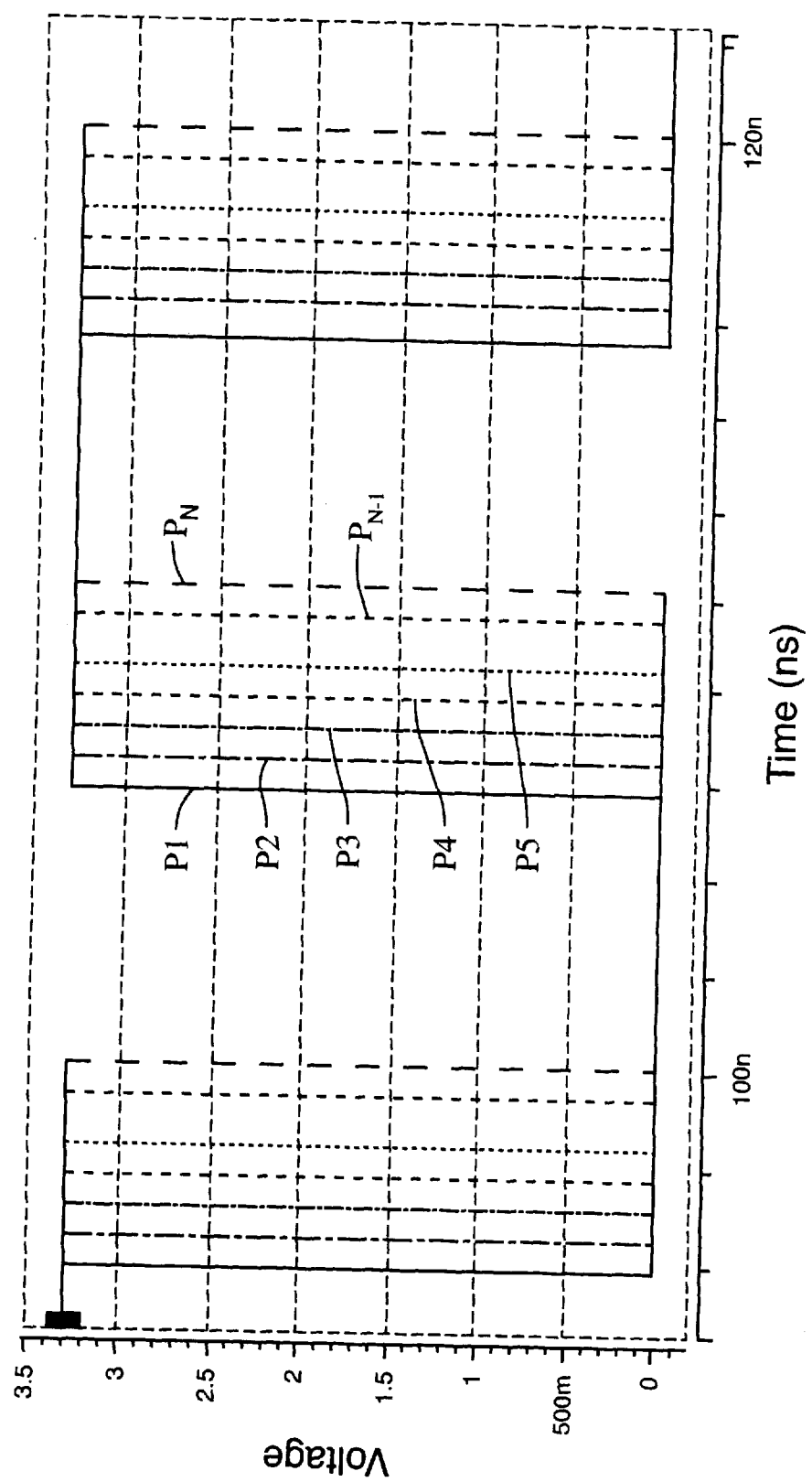
FIG. 7 is a graph representing the output signals generated by the multi-phase generation system according to the present invention.

The amount of charge present at the first interpolator output node 70 is provided to a first input of a comparator 20. The amount of charge present at the second interpolator output node 72 is provided to a second input of the comparator 20. The output of the comparator represents the intersection (or difference) of the voltages present on the first interpolator output node 70 and the second interpolator output node 72 of the phase interpolation block 18. The intersection of the voltage phases present at the first interpolator output node and the second interpolator output node are represented as $I_1, I_1, I_3 \ldots I_N$ in FIG. 6. These several phase intersections are provided by the comparator 20 as a series of waveforms as illustrated in FIG. 7. The waveforms shown in FIG. 7 are the multiple phases $(P_1, P_2 \ldots P_N)$ that are generated during a single clock cycle of the input signal, clkin. The multiple phases generated by the comparator of the multi-phase generation system of the present invention have a cyclic property. This cyclic property of the multiple phases means that the generated phases form a cycle of increasing or decreasing phases that complete over 360° of a clock cycle.

As shown, the multi-phase generation system of the present invention generates multiple phases $P_1 \ldots P_N$ during a single clock cycle of an input signal without using either a PLL or a DLL. By not having to use either a PLL or a DLL to generate the multiple phases illustrated in FIG. 7, the phase generation system of the present invention can be used in conjunction with low power devices and applications. Further, the phase generation system of the present invention can be used in high frequency applications. Moreover, with its relatively small footprint, the phase generation system of the present invention does not take as much of the valuable real estate as conventional PLL systems.

Figure 8:
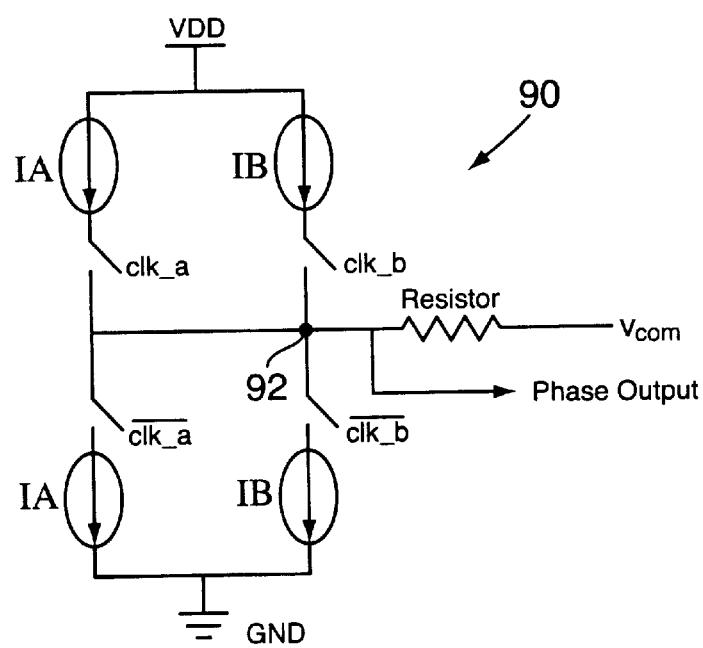
FIG. 8 is a schematic diagram of the current phase interpolator block according to an alternate embodiment of the present invention.

FIG. 8 is a schematic diagram of the current phase interpolator block 90 according to an alternate embodiment of the present invention. The difference between the current phase interpolator block 90 illustrated in FIG. 8 and the current phase interpolator block 18 illustrated in FIG. 5 is that the alternate interpolator block 90 is a single ended block, wherein the multiple phases provided by the comparator 20 represent a comparison between the voltage present at a single output node 92 and the common mode voltage (Vcom) of the interpolator block 90.

The above detailed description of the present invention has been provided for the purposes of illustration and description. It is not to be limited to the precise embodiments disclosed therein. Although several embodiments of the invention have been described in detail, many modifications and variations of the present invention are made possible in light of the above teaching. Thus, the scope of the present invention is to be defined by the claims appended hereto.

What is claimed is:

1. A method of generating multiple phases from a single input source, comprising:

(a) generating a plurality of output signals from an input signal, each of the plurality of output signals representing a phase-shifted version of the input signal;

(b) selecting a pair of signals from the plurality of output signals to act as clock signals, the selected pair of clock signals defining the operating timing region of the multiple phases;

(c) providing a pair of complementary weighted bias currents, the pair of complementary bias currents used to generate the multiple phases within the operating timing region in response to at least one control signal;

(d) adjusting the pair of weighted bias currents in response to the selected pair of clock signals, the selected pair of clock signals operative to adjust the rate of change of the weighted bias currents at an output node; and (e) providing a plurality of signals representing the difference between the value of a first one of the adjusted weighted bias currents of step (d) and a second signal.

2. The method of claim 1, wherein step (c) comprises the steps of:

(e1) providing one of the adjusted weighted bias currents to a first input of a comparator; and (e2) providing the second signal to a second input of a comparator, the second signal having a predetermined frequency.

3. The method of claim 1, wherein one of the adjusted weighted bias currents is generated by applying a first weighted bias current to a first of the at least one control signals, the second value is generated by applying a second weighted bias current to a second of the at least one control signals, and wherein the multiple phases are represented by the differences between the first of the at least one control signals and the second of the at least one control signals.

4. The method of claim 2, further comprising the step of subtracting the frequency of the signal provided at the first input of the comparator from the frequency of the signal provided at the second input of the comparator.

5. The method of claim 1, wherein the output signals of step (a) are each phase-shifted $2\pi/n$ degrees relative to the input signal, where n is an integer.

6. The method of claim 5, wherein the variable n has a value in the group consisting of 1, 2, or 3, 4.

7. A system for generating multiple phases from a single input source, comprising:

an output signal generator for generating a plurality of output signals in response to an input signal, each of the output signals being a phase-shifted version of the input signal;

a quadratic region selector for selecting a pair of clock signals from the plurality of output signals, the selected pair of clock signals defining the operating timing region of the multiple phases;

a weighted bias generator for providing a pair of weighted complementary bias currents, the pair of weighted complementary bias currents used to generate the multiple phases within the operating region in response to a control signal; and a current phase interpolator operative to generate the multiple phases by adjusting the application of the pair of weighted complementary bias currents to a phase interpolator node in response to the selected pair of clock signals.

8. The system of claim 7, wherein each of the plurality of output signals is phase-shifted $2\pi/n$ degrees relative to the input signal.

9. The system of claim 7, wherein the variable n is an integer having a value consisting of 1, 2, 3, 4.

10. The system of claim 7, wherein the weighted bias current block further includes: a current source; a plurality of bias reference transistors; a plurality of selection transistors; and a pair of output nodes, wherein one of the output nodes provides a first weighted bias current in response to the selected clock signals being applied to the selection transistors and the second one of the output nodes provides a second weighted bias current in response to the selected clock signals being applied to the selection transistors, the second weighted bias current having a value complementary to the value of the first weighted bias current such that the total amount of current remains constant.

11. The system of claim 7, wherein the current phase interpolator block further includes: a first pair of parallel connected current sources, each current source having a plurality of complementary control switches coupled thereto for connecting a respective one of the first pair of current sources to a first output node;

a second pair of parallel connected current sources, each current source having a plurality of complementary control switches coupled thereto, for connecting a respective one of second pair of current sources to a second output node; and a comparator having a first input connected to the first output node and a second input connected to the second output node, wherein the comparator provides a signal representative of the phase difference between the signal provided on the first output node and the signal provided on the second output node.

12. The system of claim 7, wherein the current phase interpolator block further includes: a pair of parallel connected current sources, each current source having a control switch coupled thereto for connecting a respective one of the pair of current sources to an output node; and a comparator having a first input coupled to predetermined value and a second input connected to the output node, wherein the comparator provides a signal representative of the phase difference between the predetermined value and the signal provided at the output node.

13. The system of claim 12, wherein the predetermined value is represented by the common mode voltage of the interpolator block measured at the output node.

14. The system of claim 13, wherein the selected pair of clock signals controls the rate of change of voltage charging present at the output node, such that the signal provided by the comparator is a measure of the intersection of the rate of change of the charge present at the output node and the common mode voltage of the interpolator block.

15. The system of claim 11, wherein the first plurality of complementary control signals controls the rate of change of the charge present at the first output node, the second plurality of complementary control signals controls the rate of change of the charge present at the second output node, whereby the signals provided by the comparator represent a measure of the intersection of the rate of change of the charge present at the first output node and the second output node.

* * * * *